United States Patent [19]
Kukkonen

[11] Patent Number: 5,926,071
[45] Date of Patent: Jul. 20, 1999

[54] MINIMIZATION OF THE POWER CONSUMPTION IN AN OSCILLATOR

[75] Inventor: Osmo Kukkonen, Salo, Finland

[73] Assignee: Nokia Mobile Phones, Espoo, Finland

[21] Appl. No.: 09/004,008

[22] Filed: Jan. 7, 1998

[30] Foreign Application Priority Data

Jan. 16, 1997 [FI] Finland ..................................... 970175

[51] Int. Cl.⁶ ................. H03B 5/06; H03B 5/12
[52] U.S. Cl. ..................... 331/109; 331/117 R; 331/175; 331/177 V; 331/183; 331/74
[58] Field of Search ............................. 331/57, 109, 111, 331/116 R, 116 FE, 117 R, 117 FE, 117 D, 175, 177 V, 183, 185, 186, 74

[56] References Cited

U.S. PATENT DOCUMENTS

| | | | |
|---|---|---|---|
| 4,928,314 | 5/1990 | Grandfield et al. | 331/183 X |
| 5,164,685 | 11/1992 | Niemio | 331/8 |
| 5,220,291 | 6/1993 | Hagadorn | 331/185 X |
| 5,357,222 | 10/1994 | Hietala | 332/124 |
| 5,379,003 | 1/1995 | Bizen | 331/117 R |
| 5,446,417 | 8/1995 | Korhonen et al. | 331/57 |
| 5,606,294 | 2/1997 | Richards | 331/109 |

FOREIGN PATENT DOCUMENTS

| | | |
|---|---|---|
| 0 317 150 A3 | 5/1989 | European Pat. Off. . |
| 0 326 940 A3 | 8/1989 | European Pat. Off. . |
| WO 90/13947 | 11/1990 | WIPO . |
| WO 90/15484 | 12/1990 | WIPO . |

*Primary Examiner*—David Mis
*Attorney, Agent, or Firm*—Perman & Green, LLP

[57] ABSTRACT

A method is presented for minimizing the current consumption and the operating voltage of a voltage controlled oscillator. According to the invention the oscillator's (Q2) output signal (RFout) is detected as a DC voltage signal (Vgs) in a clamp/voltage multiplier circuit (U1, U2), preferably after a isolating amplifier (Q1). This detected signal is supplied in a feedback loop to a field effect transistor (FET1) controlling the oscillator's (Q2) current, whereby the field effect transistor controls the current (Ib) in the main current path to a predetermined minimum value. In this superimposed arrangement of the oscillator and the isolating amplifier the supply voltage (B) can be minimized by arranging, regarding the DC current, the isolating amplifier (Q1) in parallel with the field effect transistor (FET1) in the emitter branch of the oscillator (Q2).

11 Claims, 3 Drawing Sheets

MINIMIZATION OF THE POWER CONSUMPTION IN AN OSCILLATOR

BACKGROUND OF THE INVENTION

The invention relates to a method for controlling the current of a voltage controlled oscillator, and respectively, to a circuit arrangement for controlling the current of a voltage controlled oscillator.

One of the most important objectives given to a designer of modern mobile phones, particularly the small-sized so called pocket phones, is to maximize the operating time. Thus the minimization of the operating current of the device is one of the most important design criteria. At the same time the goal is to provide as light and small-sized devices as possible, and thus also the number of battery cells generating the operating current should be limited. In other words, the objective should be an operating voltage which is as low as possible.

FIG. 1 shows the basic configuration of a typical prior art voltage controlled oscillator (VCO) in which a target was to observe the above mentioned requirements concerning the operating current and voltage. Here the VCO comprises an actual oscillating circuit or oscillator and an isolating amplifier, which is required so that changes in the environment do not substantially affect the operation of the oscillator. In order to minimize the power consumption the oscillating circuit and the amplifier circuit in this embodiment are "superimposed", in other words, the same supply current, a DC current, flows through both stages, as is seen in FIG. 1.

The oscillating circuit is formed by the transistor Q2 with associated passive components. The isolating amplifier circuit is formed by the transistor Q1 with associated passive components. The transistors Q1 and Q2 are "superimposed", or the same current flows through both transistor stages Q1 and Q2. A disadvantage of this configuration is that the total operating voltage increases, because it is formed by the sum of the operating voltages of both stages. The DC signal controlling the resonance frequency of the oscillating circuit is supplied to the interface Vctrl.

The combined operating voltage B of the circuits, which in FIG. 1 is typically 4.5 V, is suitably divided between the transistors. When the resistor R5 between the emitter of the transistor Q2 and ground is suitably selected, the current flowing through the transistors Q1 and Q2 will remain almost constant regardless of changing conditions, primarily temperature. However, a disadvantage of this configuration is that in spite of the constant current the output voltage may vary substantially, primarily due to parameter variations between individual transistors and tolerances of the passive components of the configuration.

The superimposed transistor stages of FIG. 1 inevitably result in an increased total voltage requirement, compared to transistor stages supplied directly from the voltage supply, because the operating voltage B is now the sum of the voltages applied over the transistor stages (for instance B=4.5 V). In the arrangement of FIG. 1 a considerable part of the operating voltage is "lost" in the emitter resistor R5 of the oscillator stage. In the case of FIG. 1 a suitable value of the resistor is e.g. 270 Ω. This resistance could be reduced, but in practice one can take about 100 Ω as the lower limit, below which the stability of the bias voltage (DC bias) of the transistor stage is lost. This is a well known situation to a person skilled in the art, so there is no need to describe the basic circuit theory in more detail. Also at the lower resistance value of 100 Ω the emitter DC bias will remain at a level of about 1 V, when a value of about 10 mA is used as the operating current through the stages in the arrangement. The result of this is, that even at the lowest level the total operating voltage generated by the battery B should be about 3 V.

The U.S. Pat. No. 4,968,952 presents a VCO with automatic current control. This patent aims at a control circuit which detects a direct current (DC) signal representing the oscillating current of the VCO circuit, in other words the oscillating state of the VCO circuit, and this signal is then used to control the VCO oscillator. As is presented in more detail in this patent description, a signal representing the voltage level is obtained either from the emitter or collector of the VCO oscillator's transistor, and then the alternating voltage (AC) component is intentionally filtered away in order to have a feedback signal comprising only the DC component. The object of the feedback signal is to keep a constant output power of the VCO so that also the oscillator noise is kept at a low level. However, the arrangement does not aim at minimizing the oscillator current, and the arrangement is not suitable to be used at low operating voltages due to the resistive components at both the emitter and collector of the transistor.

SUMMARY OF THE INVENTION

The object of this invention is to reduce the current more effectively in a VCO/isolating amplifier arrangement.

Another object of this invention is to reduce the total operating voltage in a VCO/isolating amplifier arrangement.

A third object of this invention is to reduce the power demand of a VCO/isolating amplifier arrangement by reducing both the total operating voltage of the arrangement and the operating current of the arrangement.

A fourth object is to ensure that the oscillator will start reliably in all conditions.

These objects are achieved with the method having the features set forth below.

An essential feature of the invention is that the high frequency output signal of the oscillator is detected as a DC voltage signal, whereby the current of the oscillator's main current path is controlled in a negative feedback loop. If the level of the output signal increases, then the detected signal increases, and in the negative feedback loop it decreases the main current of the oscillator, e.g. by increasing the channel resistance of a field effect transistor in the oscillator's main current path.

Preferably the output signal of the oscillator is amplified in an isolating amplifier arranged in the main current path, whereby the current of both oscillator and isolating amplifier can be controlled to a predetermined minimum level with the same controlling component, preferably a field effect transistor. The isolating amplifier can be connected in a "superimposed" relation to the oscillator, either on the collector or the emitter side of the transistor acting as the oscillator.

Preferably the combined operating voltage of the oscillator and the isolating amplifier connected on top of each other in the main current path, or the battery voltage of the circuit arrangement, is minimized according to the invention so that regarding the DC current the isolating amplifier is coupled in parallel with the current controlling component, so that there are no resistors in the main current path.

With the method and the circuit arrangement according to the invention it is thus possible to minimize the current and the operating voltage of the circuit arrangement formed by the oscillator and the isolating amplifier, whereby also the power of the circuit arrangement is minimized.

Particularly the invention provides a good start-up behavior of the oscillator circuit, so that in the start-up state the current in the main current path is made higher than the minimum current existing in the active operating state.

The invention is preferably applied in the voltage controlled oscillator circuit of a mobile phone.

BRIEF DESCRIPTION OF THE DRAWING

The invention is described below with the aid of a drawing, in which.

DETAILED DESCRIPTION OF THE INVENTION

Figure 1:
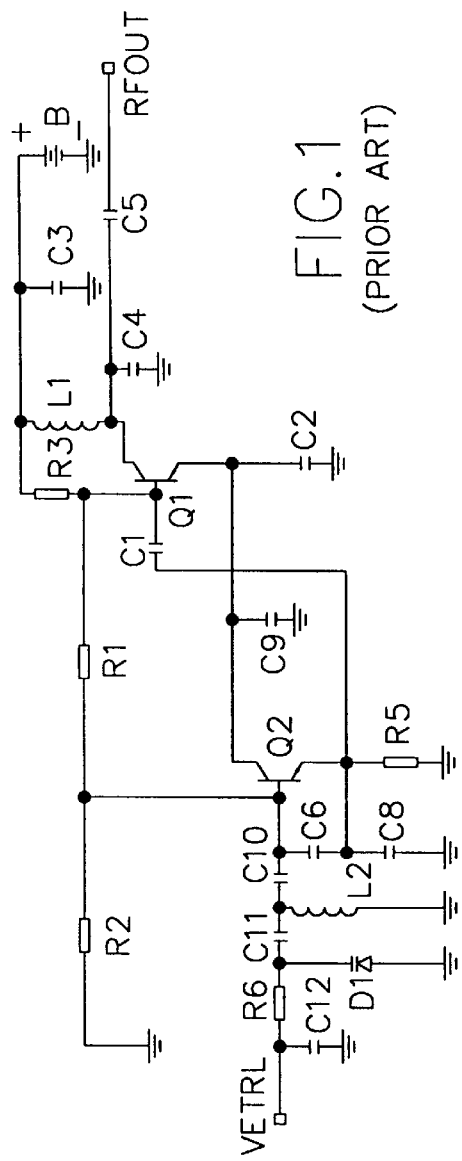
FIG. 1 shows a prior art oscillator and an isolating amplifier coupled in series regarding the supply voltage, which circuit arrangement was already described above.
Figure 2:
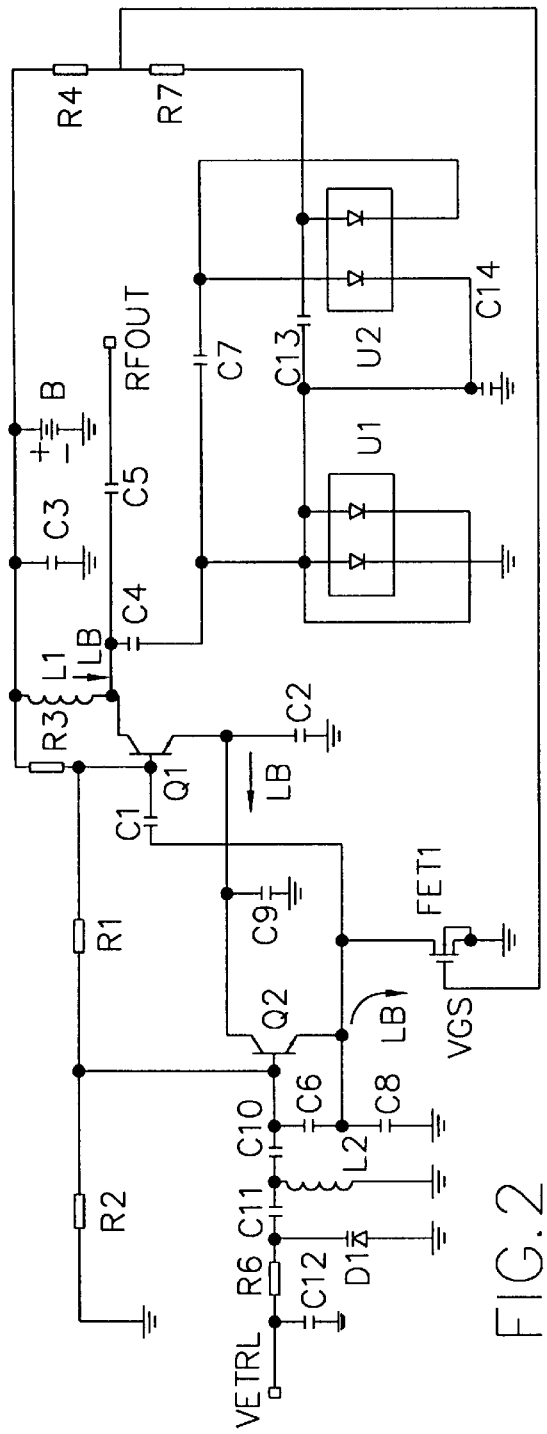
FIG. 2 shows a circuit solution according to the invention, which reduces the operating current of the oscillator and the isolating amplifier.

FIG. 2 shows a VCO circuit arrangement according to the invention, which is a so called superimposed circuit arrangement, similar to that of FIG. 1. The basic task of the circuit arrangement of FIG. 2 is to provide a constant output level having a required minimum value, and at the same time to save current. In order to realize this the current of the circuit is controlled with the aid of a negative feedback arrangement. The output level is controlled to a certain desired minimum value. The current and the output level have a relationship of the first order, whereby a minimum output level also produces a minimum current.

In this connection it must be noted that the current also has an effect on the phase noise of the oscillator. However, the effect is of the second order, which a person skilled in the art can take into account, for instance by selecting suitable Q-values for the components of the resonance circuit. Further the effect of the control voltage generating circuit U1, U2 on the oscillator's noise level is minimized by connecting said circuit to the output of the isolating amplifier. The impedance of the circuit generating the control voltage varies as a function of the signal level RFout supplied to it. A very important characteristic of the isolating amplifier Q1 is the reverse transmission coefficient (S12), which is optimized with the aim that the impedance variations of the circuit generating the control voltage will not appear in the output of the oscillator Q2 itself.

In FIG. 2 the reference numerals used correspond to those of FIG. 1, and the values of the components in FIG. 2 are:

R1=2700 Ω; R2=5600 Ω; R3=560 Ω; R4=220 Ω; R5=270 Ω; R6=470 Ω;

L1=10 nH; L2=5.60 nH;

C1=1.50 pF; C2=18 pF; C3=18 pF; C4=22 pF; C5=18 pF; C6=1.20 pF; C7=18 pF; C8=2.20 pF; C9=100 pF; C10=1.50 pF; C11=3.90 pF; C12=47 pF; C13=18 pF; C14=18 pF.

The supply voltage is obtained from the power supply B with the voltage 4.50 V. The transistors Q1 and Q2 are of the type NE68119, and the MOS field effect transistor is of the type BSS83. The diode pairs U1 and U2 are of the type BAT62.

In the circuit arrangement according to FIG. 2 the output level RFout is detected as a DC voltage with the aid of the diode pairs U1 and U2, which form a clamp/voltage multiplier circuit arrangement, well known to a person skilled in the art. In this case the negative polarity is used for the detected voltage, but the invention is not limited to this, but also a positive voltage can be used, if it is better suited to the rest of the circuit arrangement.

The multiplication factor can also be selected according to the requirements of the circuit arrangement. In the example of FIG. 2 the multiplication factor is 4, but this does not limit the application of the invention.

The level detector is preferably used as a part of the output matching circuit in the isolating amplifier. The detected voltage is scaled to the desired level with the resistors R4 and R7, and this voltage controls the gate voltage Vgs of the MOSFET transistor FET1. In this example a transistor of the type BSS83 is selected as the transistor which replaces the emitter resistor R5 of the VCO transistor in FIG. 1 controlling the current Ib of the circuit arrangement.

The channel resistance of the field effect transistor FET1 depends on the gate-source voltage Vgs of the transistor. This voltage is now proportional to the level of the detected DC voltage, and thus further proportional to the RF output level of the isolating amplifier. When the high frequency level increases, the detected voltage will be more negative, and the gate voltage of the field effect transistor will decrease. This in turn increases the channel resistance of the field effect transistor FET1, whereby the current through the stages will decrease. This lower current decreases the gain of both stages and restores the high frequency level, in other words this represents a negative feedback. With this method the output level can be made constant, to a level depending on the selected component value, and at the same time the circuit's current consumption can be minimized to a selected minimum level, which produces the selected output level. Thus the feedback in this invention is based on the fact that the signal supplied in the feedback loop to the oscillator transistor is a DC voltage, which is proportional to the AC voltage level of the oscillator output, and which aims at minimizing the oscillator current in the circuit arrangement, in which the operating voltage is very low.

The method according to the invention is particularly suited to be used in connection with controlled high frequency oscillators, because the feedback methods well known from low frequency technology will not provide the same results, as in these known methods the circuit's output signal, or the AC voltage, is returned with a certain predetermined phase from the circuit output to the circuit input. In said circuits the phase shift depends on the frequency in use, which could lead to problems when the concerned high frequency oscillator operates on a wide frequency range, and further the phase shift circuits will slow down the circuit.

The values shown in table 1 were obtained when the circuit arrangement of FIG. 2 was tested. The first column in the table shows the gate-source voltage Vgs. The second column shows how the current Ib depends on the gate voltage Vgs, and the third column shows how the output level RFout depends on the gate voltage Vgs. The measurements were made so that the feedback loop was open (because otherwise the feedback would try to retain a constant output level, as a person skilled in the art would understand). The current of the circuit was controlled by supplying different DC voltage levels directly to the gate of FET1, in other words the DC level from the output signal RFout was not connected to the gate during the measurement.

TABLE 1

| Vgs (V) | Ib (mA) | RFout (dBm) |
|---------|---------|-------------|
| 1.80 | 3.63 | −13.54 |
| 1.90 | 4.40 | −10.75 |
| 2.00 | 5.27 | −8.36 |
| 2.10 | 6.17 | −6.34 |
| 2.20 | 7.14 | −4.56 |
| 2.30 | 8.15 | −3.06 |
| 2.40 | 9.23 | −1.68 |
| 2.50 | 10.37 | −0.46 |
| 2.60 | 11.52 | +0.58 |
| 2.70 | 12.64 | +1.47 |
| 2.80 | 13.82 | +2.27 |
| 2.90 | 14.96 | +3.04 |
| 3.00 | 16.08 | +3.69 |

Table 2 shows how the gate voltage depends on the output level RFout.

TABLE 2

| RFout (dBm) | Vgs (V) |
|-------------|---------|
| RF = off | 2.66 |
| −10 | 2.42 |
| −9 | 2.39 |
| −8 | 2.35 |
| −7 | 2.30 |
| −6 | 2.25 |
| −5 | 2.19 |
| −4 | 2.12 |
| −3 | 2.05 |
| −2 | 1.96 |
| −1 | 1.86 |
| 0 | 1.76 |
| +1 | 1.64 |
| +2 | 1.50 |
| +3 | 1.34 |
| +4 | 1.16 |
| +5 | 0.90 |

In a start-up situation, when RF=off, the value of the gate voltage Vgs is 2.66 V, whereby the corresponding current is about 12 mA. This current ensures a reliable circuit start-up in all ambient conditions.

The basic idea of the invention does not in any way limit the technology with which the high frequency level is detected into a control voltage, but the enclosed circuit arrangement is only an example of a preferred way to realize the desired function. A person skilled in the art can easily develop a circuit arrangement realizing the corresponding function, in accordance with the requirements and priorities of the respective circuit arrangement. Further, the component used to control the current is not limited to the MOS-FET transistor shown in the example, but in order to realize the inventive idea it is also possible to use other components and circuit arrangements well known to a person skilled in the art.

Figure 3:
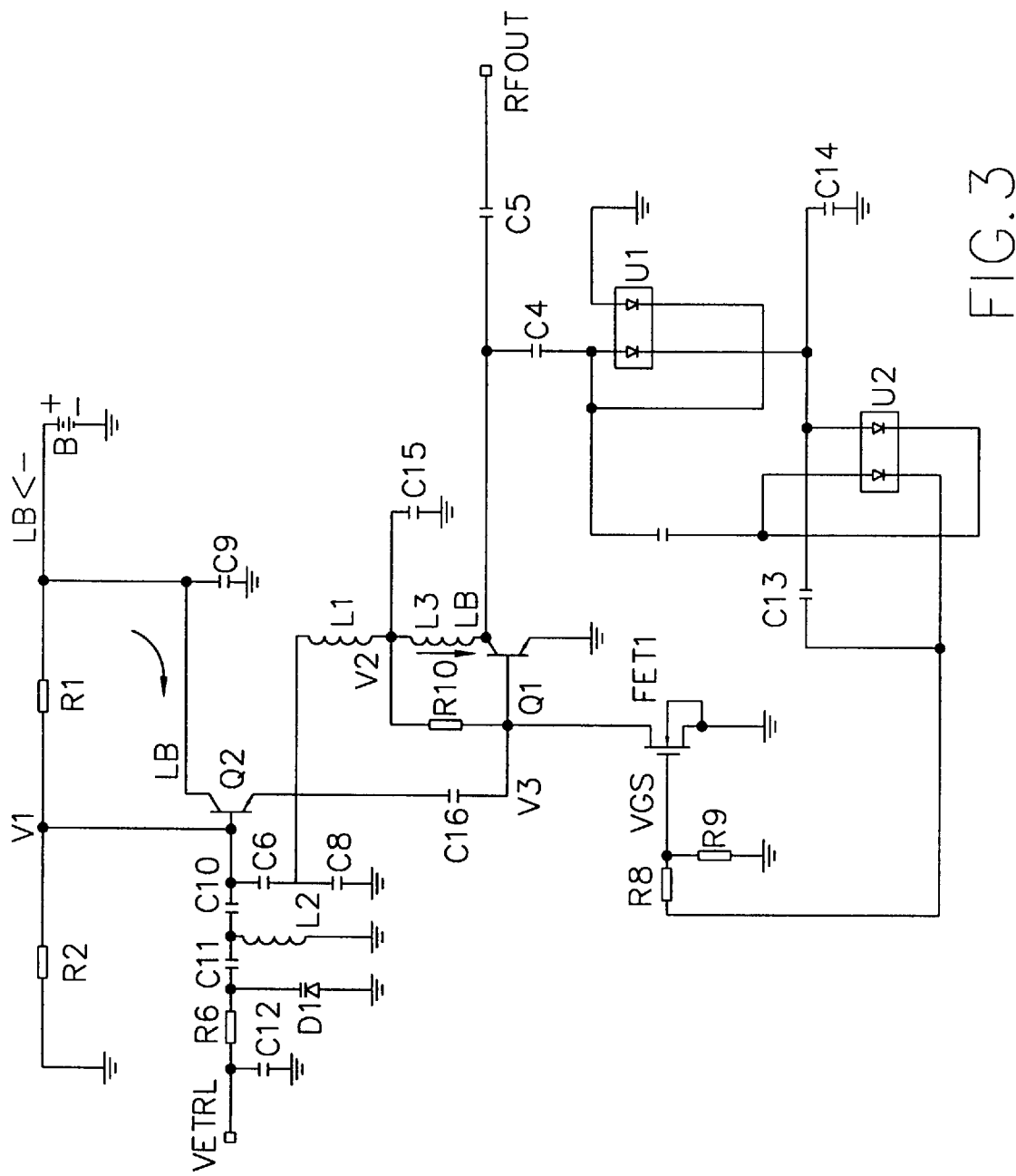
FIG. 3 shows another circuit arrangement according to the invention, which reduces the operating current and the operating voltage of the oscillator and the isolating amplifier, which in other words reduces the power consumed by the circuit.

Thus also the order of the transistor stages can be changed, as in FIG. 3, which shows a circuit arrangement providing a lower total operating voltage. The "top" stage in FIG. 3 is now the voltage controlled oscillator, which is formed by the transistor stage Q2 with associated passive components, and below it is the isolating amplifier stage, which is formed by the transistor Q1 with associated passive components. According to the invention the circuit arrangement of FIG. 3 utilizes the voltage over the emitter resistor R5 of the oscillator stage Q2 in FIG. 1 as the operating voltage of the isolating amplifier Q1, whereby the voltage over the resistor R5, or over the circuit replacing the resistor, is not anymore a "lost voltage". The voltage acting over the emitter resistor, or over the circuit replacing the resistor, is still at a minimum of the order of about 1 V, which well enough suffices as the operating voltage of one transistor stage, the isolating amplifier Q1.

In a way known per se, the circuit arrangement of FIG. 3 utilizes the so called active biasing in the lower transistor stage Q1, whereby a stable superimposed circuit arrangement is obtained regarding the biasing. However, a prior art circuit arrangement would only guarantee the stability of the DC parameters. The circuit arrangement according to the invention also takes into account the optimization of the high frequency characteristics, as will be described in more detail below.

The top transistor stage Q2 in FIG. 3 is a normal VCO arrangement, which corresponds to the oscillator arrangement of FIG. 1. Below this arrangement a second transistor stage, the isolating amplifier Q1, is connected at the emitter of transistor Q2 and replaces the emitter resistor R5 of FIG. 1. Here it must be particularly observed that the superimposed circuit arrangement has no resistors in the so called main current path. The operating current Ib flows in the main current path from the operating voltage supply B to the collector of transistor Q2, through the transistor Q2, and from its emitter further through the inductances L1 and L3 to the collector of transistor Q1, through the transistor Q1, and from its emitter further to ground. This means also that the "lost voltage" mentioned in the description of the prior art situation according to FIG. 1 is wholly eliminated, and correspondingly the required operating voltage is minimized. In the circuit arrangement of FIG. 3 the operating current Ib is preferably about 9.5 mA.

The circuit arrangement according to the invention in FIG. 3 uses an operating voltage B of about 2 V, even if a lower voltage, e.g. in the interval 1.5 . . . 2 V could be selected by a suitable design. The stability of the DC bias is ensured by controlling the base-emitter voltage of the isolating amplifier Q1. It is made in the same way as in the arrangement of FIG. 2, or the DC voltage level proportional to the high frequency signal output RFout is detected by using Schottky diodes U1 and U2, which again are connected in a clamp/voltage multiplier arrangement well known to a person skilled in the art. The DC voltage level detected by the diodes controls the source-drain resistance of the field effect transistor FET1. The resistance formed by this field effect transistor is in series with the resistor R10 (330 Ω), so that at the point between them is formed the isolating amplifier's Q1 base voltage V3, which in the shown circuit arrangement is about 0.77 V, when the voltage V2 is 1.15 V based on the other component values. The voltage V3 can be adjusted by selecting in each application suitable values for the resistors R8 and R9 forming the voltage divider or the scaling circuit.

The input circuit of FIG. 3 operates generally in the same way as in FIG. 1. With the shown component values the base voltage V1 is about 1.58 V.

The circuit arrangement of FIG. 3 combines the current minimization in the same way as in FIG. 2, and further it minimizes the required operating voltage B. This means thus also that the operating power of the presented oscillator circuit is minimized. In the circuit arrangement according to FIG. 3 the output level RFout is also kept almost constant, which in most applications is a desired characteristic. Further, the start-up situation, when the operating voltage is connected to the circuit, is well managed: the resistor R9 ensures that in the start-up situation there is no charge on the gate of the field effect transistor, so the channel resistance of the field effect transistor is almost infinite. Then the operating current of the superimposed stages is in the start-up situation about 13 mA, which again ensures a reliable start-up in all ambient conditions.

Preferably the oscillator according to the invention is used as a local oscillator in a radiotelephone, where very high requirements are placed on the quality of the oscillator signal.

In the receiver of a radiotelephone the local oscillator signal is mixed, in the receiver mixer, with the received signal in order to generate the intermediate frequency signal. In a direct conversion receiver the received signal is mixed directly to the baseband frequency. In the transmitter section of the radiotelephone the local oscillator signal is used to mix the signal modulated with the baseband signal to the final frequency of the transmitter.

The local oscillator is further characterized in that it must be possible to control its frequency in a quite wide range, and that it must be possible to change the frequency very rapidly. In radiotelephone applications the controlled local oscillators typically operate on the UHF frequency band.

Figure 4:
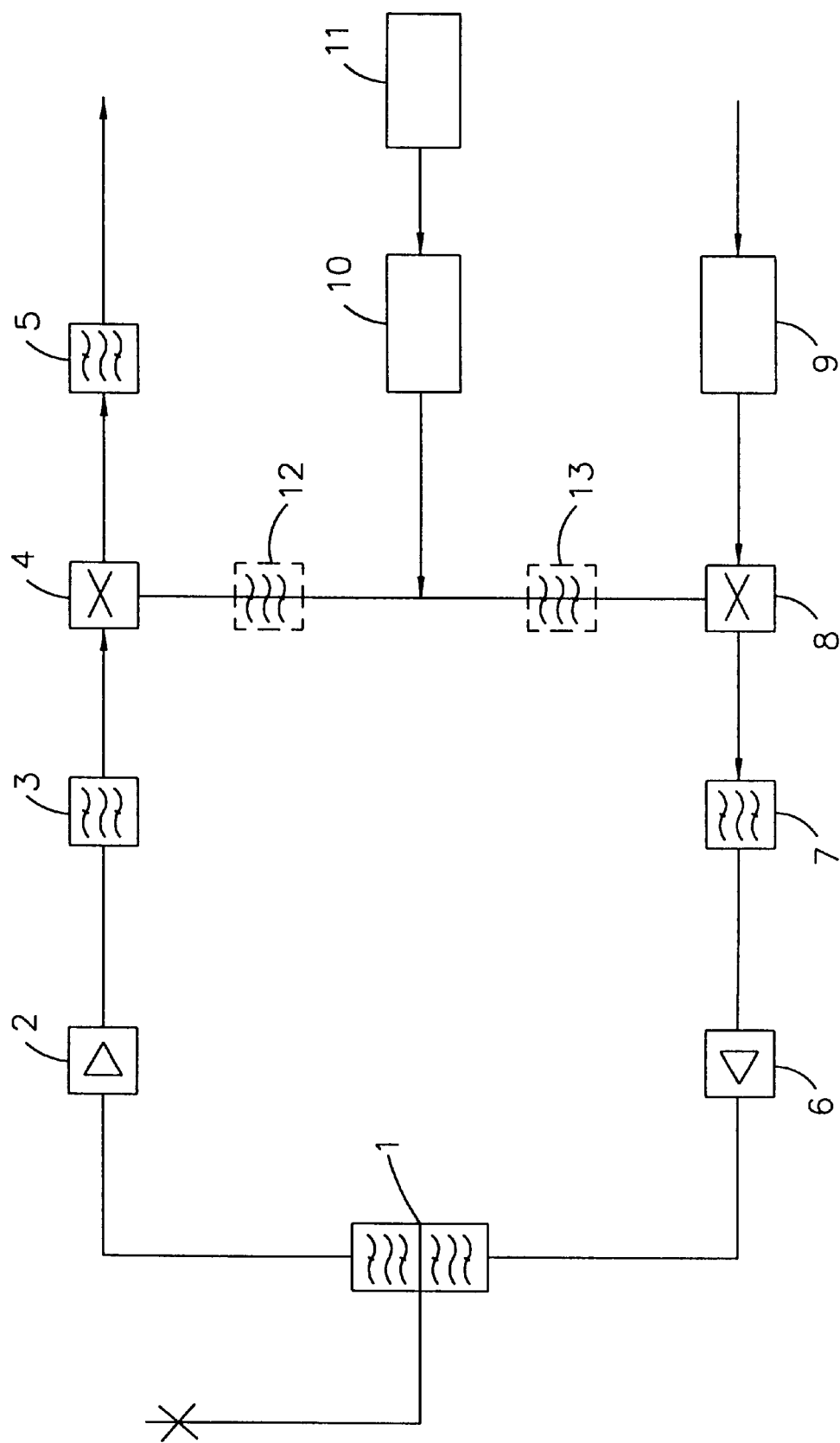
FIG. 4 shows as a block diagram a typical application of the invention.

FIG. 4 shows as a block diagram a typical application, in which the reference numerals have the following meanings:

1 is the duplex filter, which separates the transmitted and the received signals from each other;
2 is the high frequency amplifier of the receiver (LNA, low-noise amplifier);
3 is the band-pass filter of the receiver;
4 is the mixer of the receiver;
5 is the intermediate frequency filter of the receiver;
6 is the transmitter (high frequency amplifier);
7 is the band-pass filter of the transmitter;
8 is the mixer of the transmitter;
9 is the modulator of the transmitter;
10 is the oscillator according to the invention; and
11 is the synthesizer, which controls the oscillator according to the invention (or generates the control signal Vctrl).

The application according to the invention aims at a operating voltage (B in FIGS. 2 and 3) which is as low as possible, at a current (Ib in FIGS. 2 and 3) which is as low as possible, and on the other hand, however, at an output level of the oscillator (RFout in FIGS. 2 and 3) which is as high as possible.

Further there are very strict requirements on the signal "cleanness", such as the phase noise and the multiples of the oscillator frequency.

If the local oscillator signal contains multiples, it causes in the transmitted signal spurious emissions, which must be removed by having a more effective signal filtering, which again results either in an extra filter (13, in broken lines in FIG. 4) or in a the use of filter with several stages (7 and/or 1 in FIG. 4).

Correspondingly the multiples of the local oscillator signal cause spurious responses, and the oscillator signal must be filtered by an extra filter (12 in FIG. 4), or the filtering must be made more effective by the filters (1 and/or 3 in FIG. 4).

It is well known to a person skilled in the art that the oscillator generates multiple frequencies, if the oscillator output signal is not a symmetric sinusoidal signal. When the aim is a low operating voltage (B) and a high output level (RFout), the signal distortion will be a limiting factor. When the operating voltage is decreased far enough there will be clipping of the sinusoidal output signal of the oscillator.

As mentioned above, in radiotelephone applications the quality of the local oscillator signal is very important, and important is also the fact that a good signal quality is retained in the different ambient conditions where the telephone is used.

The circuit arrangement according to the invention can also be used to control the output signal quality of the oscillator. For instance, it is known that temperature variations have a strong influence on the operation of the transistor stage. The circuit arrangement according to the invention tries to prevent signal quality variations by preventing variations in the gain of the oscillator transistor and thus the clipping of the signal. Thus it is possible to set the current (Ib in FIGS. 2 and 3) at a level, on which the signal quality is kept within the predetermined requirements on the whole ambient temperature range in which the telephone must operate perfectly.

What is claimed is:

1. A method for controlling a current (Ib) of a voltage controlled oscillator of an oscillator circuit to maintain the current (Ib) at a predetermined level, comprising the steps of:

generating a DC voltage control signal which is proportional to an output level of the oscillator;

applying the generated DC voltage control signal in a negative feedback loop to a circuit element (FET1) for a controlling of the current of the oscillator;

providing an isolating amplifier for the oscillator, the isolating amplifier having a first transistor, the oscillator having a second transistor;

arranging said first and said second transistors in a series circuit allowing said current (Ib) to flow through said first and said second transistors;

connecting said circuit element (FET1) to one of said first and said second transistors;

controlling the current (Ib) by the circuit element (FET1); and detecting said output level of the oscillator at said isolating amplifier for reducing a required magnitude of supply voltage to the series circuit.

2. A method according to claim 1, wherein, in said current controlling step, the value of the current (Ib) is controlled to a minimum value, which results in a predetermined level of the high frequency signal output generated by the oscillator circuit.

3. A method according to claim 2, wherein
the high frequency signal is amplified by the isolating amplifier.

4. A method according to claim 3, further comprising a step of supplying the current (Ib) from a supply current source (B).

5. A method according to claim 1 wherein, in said current controlling step, there is a controlling of a current of said first transistor.

6. A method according to claim 1, wherein, in a start-up situation of the oscillator circuit, said controlling step provides that the oscillator current (Ib) is controlled to be higher than said predetermined minimum current.

7. A method according to claim 1, wherein, in said connecting step, said circuit element is a field effect transistor (FET1) operative to control current of the first transistor.

8. A control circuit for controlling current (Ib) of a voltage controlled oscillator circuit, comprising:

an isolating amplifier for isolating an output signal of said oscillator circuit from a load, and having a first transistor, wherein said oscillator circuit comprises a second transistor connected serially with said first transistor for allowing said current (Ib) to flow through said first and said second transistors;

a controllable means (FET1) controlling the current (Ib);

a detection circuit at an output of the isolation amplifier, for detecting the oscillator output signal as a DC voltage control signal;

wherein the voltage control signal is supplied in a feedback branch as a control signal to the means (FET1) controlling the current; and the control circuit further comprises a scaling circuit (R4, R7; R8, R9) in the feedback branch dimensioned so that the current (Ib) obtains a predetermined minimum value in an active balanced state.

9. A control circuit according to claim 8, wherein the means controlling the current (Ib) is a field effect transistor (FET1).

10. A control circuit according to claim 8, wherein the isolating amplifier is operative to amplify the output signal of the oscillator circuit, the current (Ib) flowing between collector and emitter of the first transistor.

11. A control circuit according to claim 8, wherein, with respect to a flow of DC current in the isolating amplifier, the first transistor is arranged in parallel with the means (FET1) controlling the current (Ib).

* * * * *